United States Patent
Chia

(10) Patent No.: US 8,129,835 B2
(45) Date of Patent: Mar. 6, 2012

(54) PACKAGE SUBSTRATE HAVING SEMICONDUCTOR COMPONENT EMBEDDED THEREIN AND FABRICATION METHOD THEREOF

(75) Inventor: Kan-Jung Chia, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 272 days.

(21) Appl. No.: 12/554,389

(22) Filed: Sep. 4, 2009

(65) Prior Publication Data

US 2011/0057305 A1 Mar. 10, 2011

(51) Int. Cl.
*H01L 23/52* (2006.01)
(52) U.S. Cl. ......... 257/690; 257/723; 257/778; 438/121
(58) Field of Classification Search .................. 257/690, 257/723, 778, E23.145, E21.499, E21.599; 438/121

See application file for complete search history.

(56) References Cited

U.S. PATENT DOCUMENTS

| 6,309,912 B1 * | 10/2001 | Chiou et al. ................. 438/118 |
| 2006/0087037 A1 * | 4/2006 | Hsu ............................... 257/738 |

* cited by examiner

*Primary Examiner* — Theresa T Doan
(74) *Attorney, Agent, or Firm* — Peter F. Corless; Steven M. Jensen; Edwards Wildman Palmer LLP

(57) ABSTRACT

A package substrate having a semiconductor component embedded therein and a method of fabricating the same are provided, including: providing a semiconductor chip with electrode pads disposed on an active surface thereof; forming a passivation layer on the active surface and the electrode pads; forming on the passivation layer metal pads corresponding in position to the electrode pads, respectively, so as for the semiconductor chip to be fixed in position to an opening of a substrate body; forming a first dielectric layer on the semiconductor chip and the substrate body; forming dielectric layer openings by laser and preventing the electrode pads from being penetrated by the metal pads; removing the metal pads and the passivation layer in the dielectric layer openings so as to expose the electrode pads therefrom; and forming a first wiring layer on the first dielectric layer for electrical connection with the electrode pads.

7 Claims, 6 Drawing Sheets

PACKAGE SUBSTRATE HAVING SEMICONDUCTOR COMPONENT EMBEDDED THEREIN AND FABRICATION METHOD THEREOF

BACKGROUND OF THE INVENTION

1. Field of the Invention

The present invention relates to package substrates and fabrication methods thereof, and more particularly, to a package substrate having a semiconductor component embedded therein and a fabrication method thereof.

2. Description of Related Art

In addition to conventional wire bonding packages, the semiconductor industry developed, thanks to ever-evolving semiconductor packaging technology, various semiconductor device packages. For example, a package substrate embedded with and electrically integrated with a semiconductor chip having integrated circuits therein, as the latest mainstream, reduces the overall volume and thickness of a semiconductor device and enhances the electrical performance thereof.

Referring to FIGS. 1A through 1L, U.S. Pat. No. 6,586,276 discloses a conventional method for fabricating a package substrate having a semiconductor component embedded therein. Referring to FIG. 1A, the wafer 10 comprises a plurality of electrode pads 101. A passivation layer 11 is formed on the wafer 10 shown in FIG. 1B. The passivation layer 11 is provided with a plurality of first openings 110 therein so as to expose the electrode pads 101 therefrom as shown in FIG. 1C. Referring to FIG. 1D, the passivation layer 11 and the electrode pads 101 are covered with an adhesive layer 12. Referring to FIG. 1E, a protective layer 13 is formed on the surface of the adhesive layer 12. Referring to FIG. 1F, the wafer 10 is singularized into a plurality of semiconductor chips 10a. Referring to FIG. 1G, a substrate body 14 with an opening 140 is provided, and the semiconductor chip 10a is received in the opening 140 of the substrate body 14, and the gap between the opening 140 of the substrate body 14 and the semiconductor chip 10a is filled with a bonding material 15 such that the semiconductor chip 10a is fixed in position to the opening 140. Referring to FIG. 1H, a conductive layer 16 is formed on the protective layer 13 of the semiconductor chip 10a, bonding material 15 as well as the substrate body 14. A resist layer 17 is formed on the conductive layer 16 as shown in FIG. 1I. Next, a plurality of resist layer openings 170 corresponding in position to the electrode pads 101, respectively, are formed in the resist layer 17. Referring to FIG. 1J, expanded pads 18 are formed on the conductive layer 16 in the resist layer openings 170 by electroplating. Referring to FIG. 1K, the resist layer 17 and the conductive layer 16 covered therewith, the protective layer 13, and the adhesive layer 12 are removed to expose the expanded pads 18 and the passivation layer 11 therefrom, wherein the expanded pads 18 have a larger size than the electrode pads 101 to facilitate alignment of a wiring layer formed after lamination of a dielectric layer. Referring to FIG. 1L, a built-up structure 19 is further formed on the expanded pads 18, the passivation layer 11 and the substrate body 14; the built-up structure 19 comprising at least a dielectric layer 191, a wiring layer 192 stacked on the dielectric layer 191, and a plurality of conductive vias 193 formed in the dielectric layer 191 and electrically connected to the expanded pads 18. A plurality of electrical contact pads 194 are electrically connected to the wiring layer 192 and formed on the surface of the built-up structure 19. The built-up structure 19 is formed with an insulating protection layer 195 thereon. The insulating protection layer 195 is provided with a plurality of insulating protection layer openings 1950 for exposing the electrical contact pads 194 therefrom, respectively.

In the conventional method for fabricating a package substrate having a semiconductor component embedded therein described above, it is necessary to form the adhesive layer 12 on the passivation layer 11 and the electrode pads 101 in order to further form the protective layer 13 on the adhesive layer 12, singularizing the wafer 10 into a plurality of semiconductor chips 10a, fix the semiconductor chip 10a in position to the opening 140 of the substrate body 14 by a bonding material 15, form the expanded pads 18 on the adhesive layer 12 and the protective layer 13, and form the dielectric layer 191 of the built-up structure 19 on the semiconductor chip 10a with expanded pads 18, the bonding material 15, and the substrate body 14. That is, the semiconductor chip 10a is required to be secured in position to the opening 140 of the substrate body 14 by the bonding material 15 first, thereby increasing the complexity of manufacturing processes. What is more, the expanded pads 18 have to be formed on the electrode pads 101 of the semiconductor chip 10a so that the built-up structure 19 can be formed, and through the expanded pads 18, damage in the electrode pads 101 of the semiconductor chip 10a can be avoided while forming openings in the dielectric layer 191 of the built-up structure 19. As a result, the conventional fabrication method complicates manufacturing processes while forming expanded pads 18, and thus the manufacturing processes are neither time-efficient nor cost-efficient. In addition, the electrical connection structure including expanded pads 18 and the conductive vias 193 is very complicated.

Therefore, it is desired to provide a package substrate embedded with a semiconductor component and a fabrication method thereof to reduce the processing time and cost as well as to avoid the structural complexity.

SUMMARY OF THE INVENTION

In light of the above drawbacks of the prior art, it is an objective of the present invention to provide a package substrate having a semiconductor component embedded therein and a fabrication method thereof that can simplify the structure of a semiconductor component and reduce the number of steps in a manufacturing process.

Another objective of the present invention is to provide a semiconductor component and a method for fabricating a package substrate having a semiconductor component embedded therein, which allows a plurality of conductive vias to be electrically connected to a plurality of electrode pads of a semiconductor chip directly.

To achieve the above and other objectives, the present invention provides a package substrate having a semiconductor component embedded therein, comprising: a substrate body having at least an opening; a semiconductor chip fixed in position to the opening of a substrate body, the semiconductor chip having an active surface and an inactive surface opposing each other, wherein the active surface has a plurality of electrode pads formed thereon and a passivation layer formed on the active surface. The passivation layer has a plurality of passivation layer openings corresponding in position to the electrode pads. Moreover, the package substrate comprises a plurality of metal rings disposed on the passivation layer openings; a first dielectric layer formed on the substrate body, the passivation layer, and the metal rings, a plurality of dielectric layer openings formed to penetrate the electrode pads, respectively, so as to expose the electrode pads therefrom; and a first wiring layer formed on the first dielectric layer as well as a plurality of first conductive vias formed in the dielectric layer openings and the passivation layer openings, respectively, for being electrically connected to the electrode pads, wherein the first conductive vias are in contact with the metal rings, respectively.

In accordance with the structure mentioned above, the passivation layer comprises a first passivation layer having openings for exposing the electrode pads therefrom and a second passivation layer formed on the first passivation layer and covering the electrode pads. The first passivation layer is made of silicon nitride ($Si_3N_4$) or silicon dioxide ($SiO_2$). The second passivation layer is made of polyimide or benzocyclobutene (BCB).

A built-up structure is disposed on the first dielectric layer and the first wiring layer. The built-up structure includes at least a second dielectric layer, a second wiring layer stacked on the second dielectric layer, and a plurality of second conductive vias formed in the second dielectric layer and being electrically connected to the first wiring layer and the second wiring layer. The built-up structure further comprises a plurality of electrical contact pads, being electrically connected to the second wiring layer, and an insulating protection layer formed thereon. Besides, there are a plurality of insulating protection layer openings in the insulating protection layer so as to expose the electrical contact pads therefrom, respectively.

Accordingly, the present invention further provides a method for fabricating a package substrate having a semiconductor component embedded therein, comprising: providing a wafer with an active surface and an inactive surface opposing each other, wherein the active surface has a plurality of electrode pads formed thereon and a passivation layer formed on the active surface, and a plurality of metal pads corresponding in position to the electrode pads, respectively, are formed on the passivation layer; singularizing the wafer into a plurality of semiconductor chips; providing a substrate body with an opening and disposing a corresponding one of the semiconductor chips in the opening; forming a first dielectric layer on the substrate body and the semiconductor chip, and filling a gap between the opening of the substrate body and the semiconductor chip with the first dielectric layer so as for the semiconductor chip to be fixed in position to the opening; forming a plurality of dielectric layer openings corresponding in position to the metal pads in the first dielectric layer by laser and exposing a portion of the metal pads therefrom; removing the metal pads and the passivation layer in the dielectric layer openings to form a plurality of passivation layer openings and expose the electrode pads therefrom, and allowing the metal pads to form a plurality of metal rings. Then, it is followed by forming a first wiring layer on the first dielectric layer, wherein the first wiring layer has a plurality of first conductive vias formed in the dielectric layer openings and the passivation layer openings and configured to be in contact with the metal rings, for being electrically connected to the electrode pads.

Further, the metal pads are formed by metallic layer etching or physical sputtering. The passivation layer comprises a first passivation layer having openings for exposing the electrode pads therefrom and a second passivation layer formed on the first passivation layer and covering the electrode pads. The first passivation layer is made of silicon nitride ($Si_3N_4$) or silicon dioxide ($SiO_2$). The second passivation layer is made of polyimide or benzocyclobutene (BCB). The laser applied to forming the dielectric layer openings is carbon dioxide ($CO_2$) laser.

To carry on, a method for forming the passivation layer and the metal pads on the active surface of the wafer is provided, comprising: forming a first passivation layer on the wafer, and forming a plurality of openings in the first passivation layer so as to expose the electrode pads therefrom; forming a second passivation layer on the first passivation layer and the openings thereof; and forming on the second passivation layer the metal pads corresponding in position to the electrode pads, respectively.

Next, the metal pads and passivation layer exposed from the dielectric layer openings are removed simultaneously; or else, removing the metal pads exposed from the dielectric layer openings is followed by removing the passivation layer exposed from the dielectric layer openings.

A method for forming the first wiring layer and the conductive vias is additionally described as follows. The steps of the method include: forming a conductive layer on the electrode pads, walls of the passivation layer openings, the first dielectric layer, and walls the dielectric layer openings; forming a resist layer on the conductive layer, and forming a plurality of resist layer openings therein so as to expose a portion of the surface the conductive layer on the first dielectric layer, the dielectric layer openings, and the conductive layer in the passivation layer openings; and electroplating the conductive layer in the resist layer openings with the first wiring layer formed thereon, and forming the first conductive vias in the resist layer openings, the dielectric layer openings and the passivation layer openings for being electrically connected to the electrode pads.

On the first dielectric layer and first wiring layer, a built-up structure is formed. The built-up structure contains at least a second dielectric layer, a second wiring layer stacked on the second dielectric layer, and a plurality of second conductive vias formed in the second dielectric layer and being electrically connected to the first wiring layer and the second wiring layer. A plurality of electrical contact pads are electrically connected to the second wiring layer on the built-up structure. Besides, the built-up structure is provided with an insulating protection layer, wherein the insulating protection layer has a plurality of insulating protection layer openings so as to expose the electrical contact pads therefrom, respectively.

In summary, the present invention provides a semiconductor component and a method for fabricating a package substrate having a semiconductor component embedded therein by singularizing a wafer, which is disposed on a passivation layer and opposite to a plurality of metal pads of a plurality of electrode pads, into a plurality of semiconductor chips. It is followed by disposing a the semiconductor chip in an opening of a substrate body and forming a first dielectric layer on the semiconductor chip and the substrate body so as to fix the semiconductor chip into the opening of the substrate body. As a result, the present invention can avoid the necessity of fastening via bonding material before forming a dielectric layer, which leads to an extra manufacturing process in prior arts. Besides, the present invention forms a plurality of dielectric layer openings in the first dielectric layer by laser and prevents the electrode pads from being penetrated by the metal pads; followed by removing the metal pads and the passivation layer in the dielectric layer openings so as to expose the electrode pads of the semiconductor chip, and forming a first wiring layer on the first dielectric layer as well as being electrically connected to the electrode pads. Hence, it is unnecessary to provide expanded pads prior to forming a built-up structure so that the cost and time to manufacture wafers can be reduced. Briefly, the present invention achieves technical effects including a protection for electrode pads of a semiconductor chip, direct electrical connection, and a reduction in the manufacturing processes.

DETAILED DESCRIPTION OF PREFERRED EMBODIMENTS

The following embodiments are provided to illustrate the disclosure of the present invention, these and other advantages and effects can be apparent to those ordinarily skilled in the art after reading this specification.

FIGS. 2A to 2D and FIGS. 3A to 3H illustrate a semiconductor component and a method for fabricating a package substrate having a semiconductor component embedded therein according to an embodiment of the present invention.

FIGS. 2A to 2D are cross-sectional diagrams showing a method for forming a passivation layer and a plurality of metal pads on a wafer according to an embodiment of the present invention.

Figure 1A:
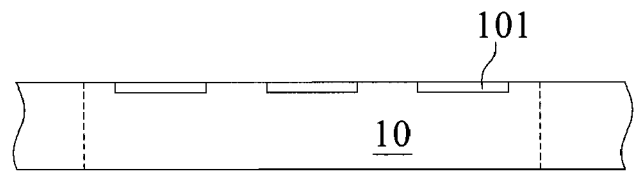
FIGS. 1A to 1L are cross-sectional diagrams showing a conventional method for fabricating a package substrate having a semiconductor component embedded therein.
Figure 1B:
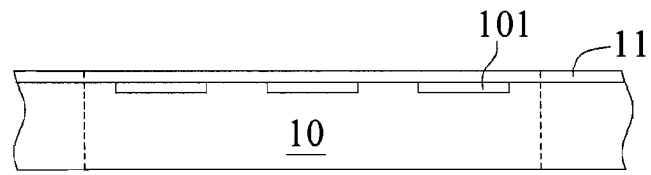
Figure 1C:
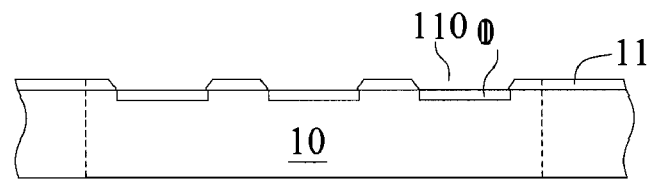
Figure 1D:
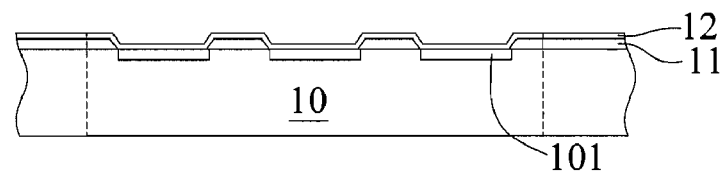
Figure 1E:
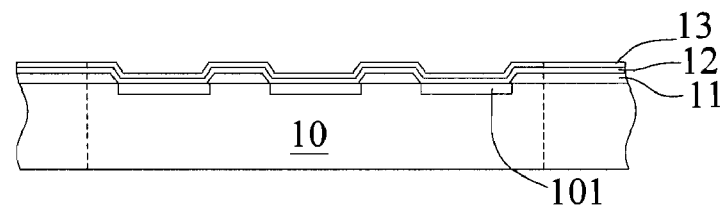
Figure 1F:
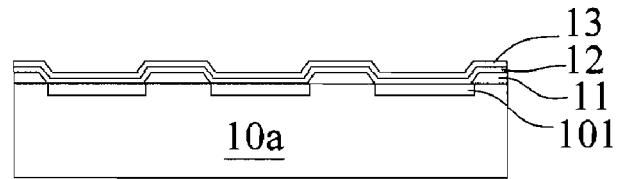
Figure 1G:
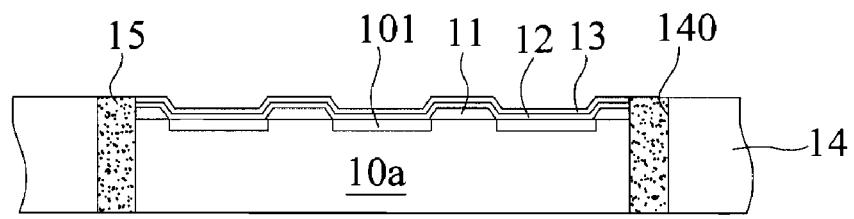
Figure 1H:
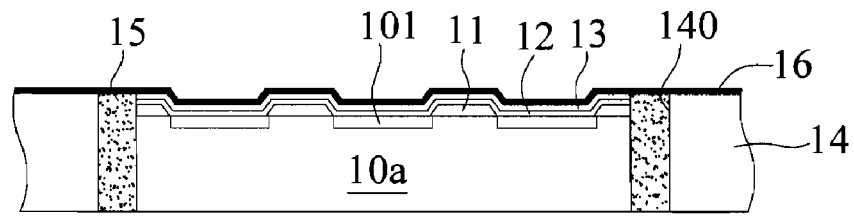
Figure 1I:
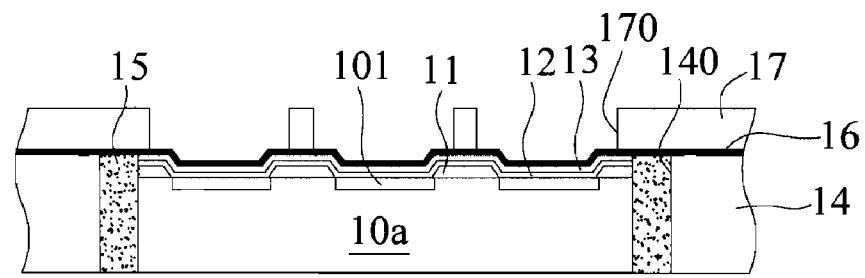
Figure 1J:
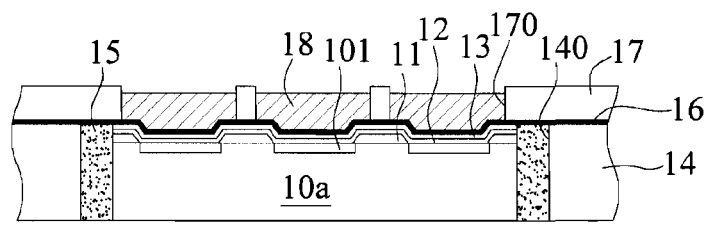
Figure 1K:
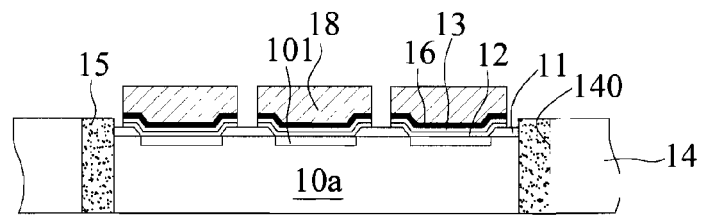
Figure 1L:
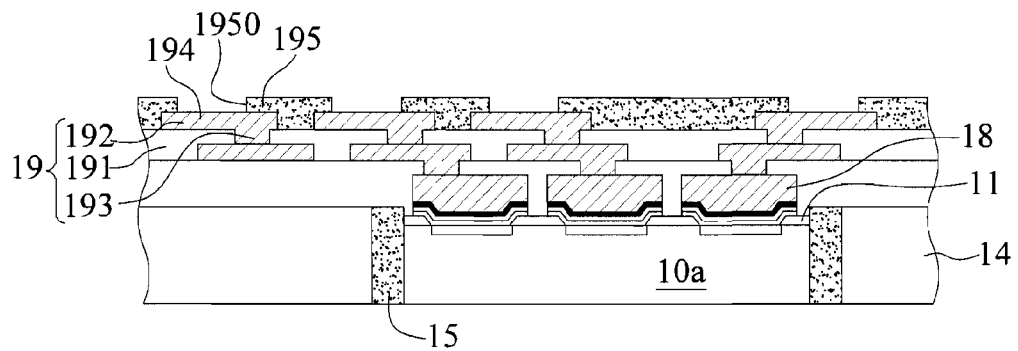
Figure 2A:
FIGS. 2A to 2D are cross-sectional diagrams showing a method for forming a passivation layer on an active surface of a wafer according to an embodiment of the present invention.

Referring to FIG. 2A, the present invention provides a wafer 20 having an active surface 20a and an inactive surface 20b opposing each other, wherein the active surface 20a has a plurality of electrode pads 201 thereon.

Figure 2B:
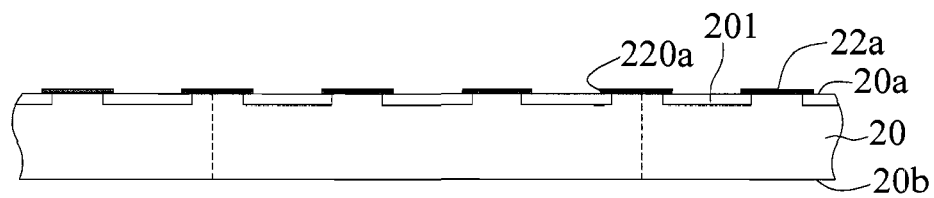

Referring to FIG. 2B, the active surface 20a of the wafer 20 is provided with a first passivation layer 22a made of silicon nitride ($Si_3N_4$) or silicon dioxide ($SiO_2$), for example. A plurality of openings 220a are formed in the first passivation layer 22a so as to expose a portion of the surface of the electrode pads 201 therefrom.

Figure 2C:
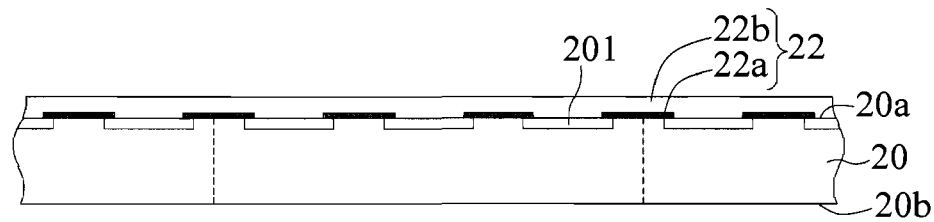

Referring to FIG. 2C, a second passivation layer 22b is formed on the electrode pads 201 and the first passivation layer 22a, and the second passivation layer 22b is made of polyimide, benzocyclobutene (BCB), and so on. The first passivation layer 22a and the second passivation layer 22b make up a passivation layer 22.

Figure 2D:
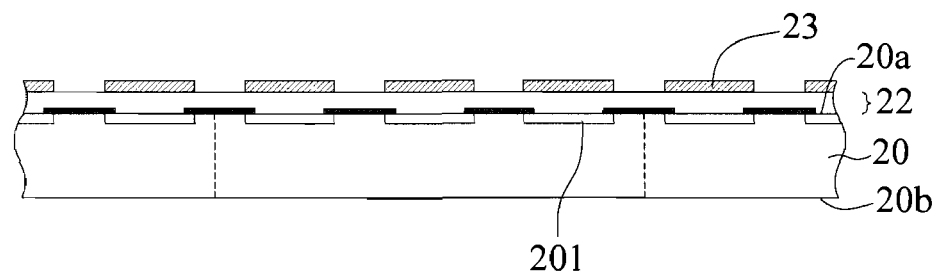

Referring to FIG. 2D, a plurality of metal pads 23 are formed on the passivation layer 22 by metallic layer etching or physical sputtering. The metallic layer etching entails forming a metallic layer, forming a resist layer on the metallic layer, forming in the resist layer a plurality of resist layer openings not corresponding in position to the electrode pads so as to expose a portion of the metallic layer, removing the portion of metallic layer not covered with the resist layer, and removing the resist layer so as to expose the metal pads. On the other hand, the physical sputtering entails disposing on the passivation layer a photomask having a plurality of holes corresponding in position to the electrode pads, forming the metal pads in the holes by means of physical sputtering, and removing the photomask to expose the metal pads.

Figure 3A:
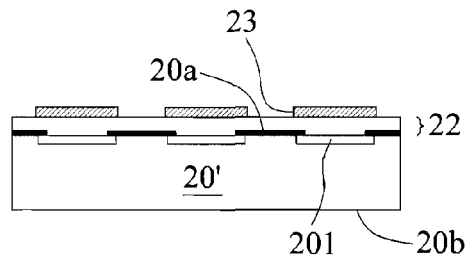
FIGS. 3A to 3H are cross-sectional diagrams showing a method for fabricating a package substrate having a semiconductor component embedded therein according to an embodiment of the present invention.

Referring to FIG. 3A, the wafer 20 is cut and singularized into a plurality of semiconductor chips 20'. Accordingly, the present invention provides a semiconductor component, including: a semiconductor chip 20' having an active surface 20a and an inactive surface 20b opposing each other, wherein the active surface 20a further has a plurality of electrode pads 201 formed thereon; a passivation layer 22 disposed on the active surface 20a and the electrode pads 201; and a plurality of metal pads 23 disposed on the passivation layer 22 and corresponding in position to the electrode pads 201.

The passivation layer 22 comprises a first passivation layer 22a and a second passivation layer 22b. The first passivation layer 22a has a plurality of openings 220a for exposing the electrode pads 201 therefrom. The second passivation layer 22b is formed on the first passivation layer 22a and covers the electrode pads 201. The first passivation layer 22a is made of silicon nitride ($Si_3N_4$). The second passivation layer 22b is made of polyimide. The metal pads 23 are made of copper (Cu).

FIGS. 3A to 3H are cross-sectional diagrams showing a follow-up method for fabricating a package substrate having a semiconductor component embedded therein according to an embodiment of the present invention.

Referring to FIG. 3A, the wafer 20 shown in FIG. 2D is provided. A plurality of semiconductor chips 20' are formed by singularizing the wafer 20, wherein each of the semiconductor chips 20' has an active surface 20a and an inactive surface 20b opposing each other. Further, the active surface 20a is disposed with a plurality of electrode pads 201 thereon as well as a passivation layer 22 formed on the active surface 20a. It is followed by disposing on the passivation layer 22 a plurality of metal pads 23 corresponding in position to the electrode pads 201.

Figure 3B:
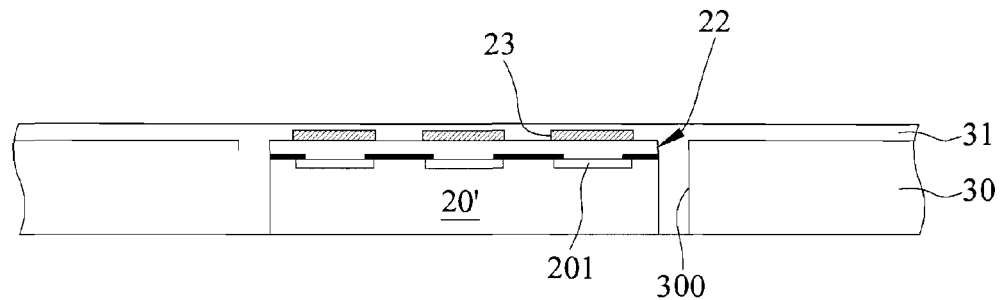

Referring to FIG. 3B, a substrate body 30 with an opening 300 is provided, and the semiconductor chip 20' is received in the opening 300 of the substrate body 30. A first dielectric layer 31 is formed on the semiconductor chip 20' and the substrate body 30, and the gap between the opening 300 and the semiconductor chip 20' is filled with the first dielectric layer 31 such that the semiconductor chip 20' is fixed in position to the opening 300, as shown in the drawing.

Figure 3C:
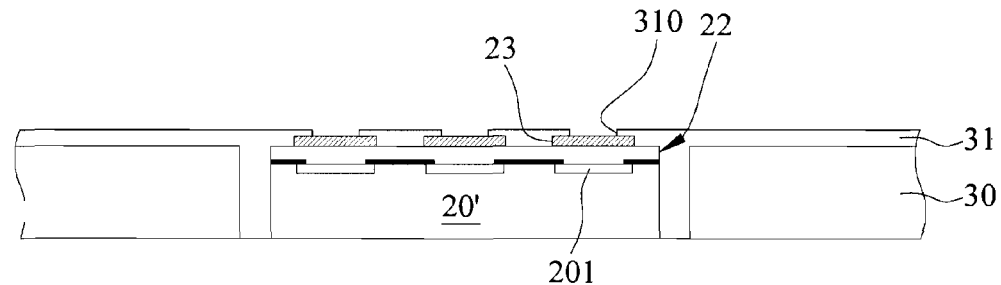

Referring to FIG. 3C, a plurality of dielectric layer openings 310 are formed in the first dielectric layer 31 by means of laser, such as carbon dioxide ($CO_2$) laser, so as for a portion of the surface of the metal pads 23 to be exposed from the dielectric layer openings 310. The metal pads 23 block incident laser and thereby prevent the incident laser from penetrating the electrode pads 201.

Figure 3D:
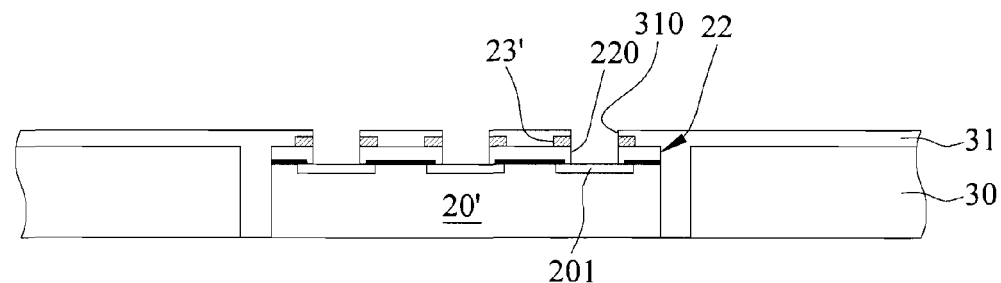

Referring to FIG. 3D, the metal pads 23 are removed by microetch, and then the passivation layer 22 is removed, so as to form a plurality of passivation layer openings 220 for exposing the electrode pads 201 therefrom and thereby form a plurality of metal rings 23' from the metal pads 23, respectively.

Figure 3E:
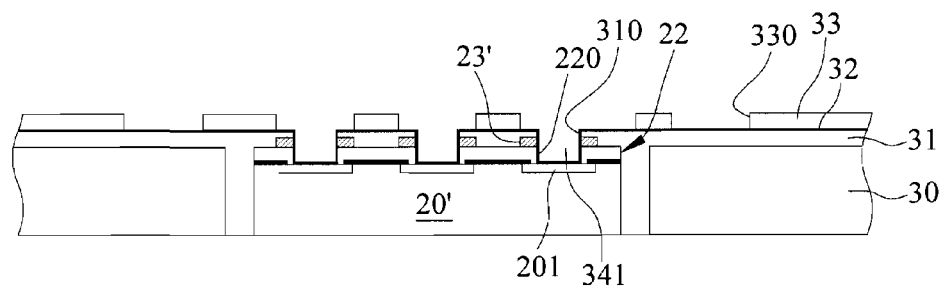

Referring to FIG. 3E, a conductive layer 32 is formed on the electrode pads 201, walls of the passivation layer openings 220, the first dielectric layer 31, and walls of the dielectric layer openings 310. The conductive layer 32 functions as a path of electric current in the metal-electroplating process (describe below), and the conductive layer 32 is made of metal, alloy, multi-deposited metallic layer, or conductive polymer. It is then followed by forming a resist layer 33 on the conductive layer 32, wherein the resist layer 33 is a dry film photoresist or a liquid photoresist. The method of disposing the resist layer 33 on the surface of the conductive layer 32 includes printing, spin coating or laminating. Later, a plurality of resist layer openings 330 are formed in the resist layer 33 by means of patterning upon exposure, developing, and etc., so as to expose a portion of the surface the conductive layer 32 on the first dielectric layer 31 and the conductive layer 32 on the walls of the dielectric layer openings 310 and on the walls of the passivation layer openings 220.

Figure 3F:
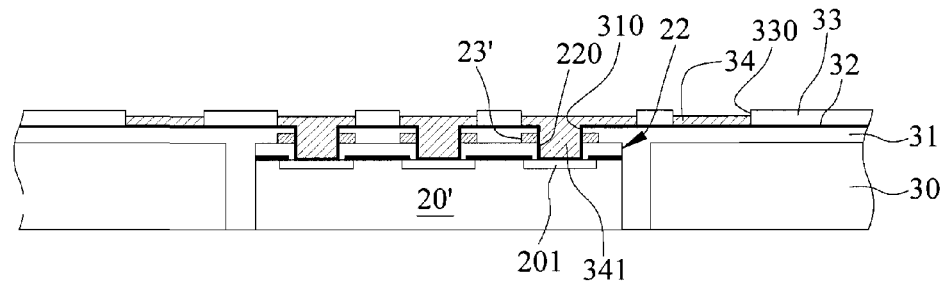

Referring to FIG. 3F, the conductive layer 32 functions as a path of electric current, and a first wiring layer 34 is electroplated to the conductive layer 32 exposed from the resist layer openings 330. Then, a plurality of first conductive vias 341 in contact with the metal rings 23', respectively, are formed in the resist layer openings 330, the dielectric layer openings 310, and the passivation layer openings 220, respectively, so as for the first wiring layer 34 to be electrically connected to the electrode pads 201.

Figure 3G:
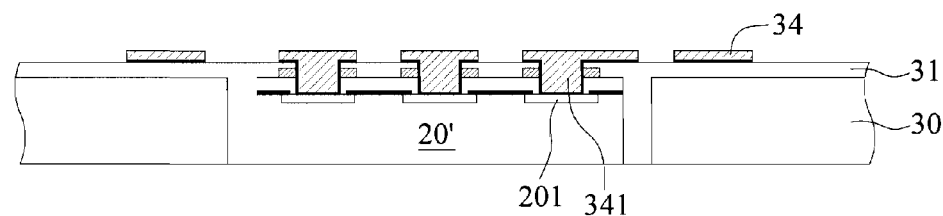

Referring to FIG. 3G, the resist layer 33 and the conductive layer 32 thereunder are removed to expose the first dielectric layer 31 and the first wiring layer 34.

Figure 3H:
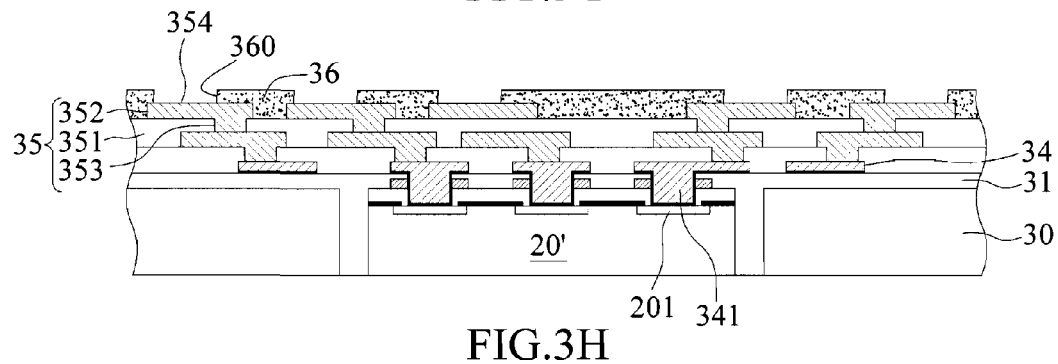

Referring to FIG. 3H, a built-up structure 35 is further formed on the first dielectric layer 31 and the first wiring layer 34. The built-up structure 35 comprises at least a second dielectric layer 351, a second wiring layer 352 stacked on the second dielectric layer 351, and a plurality of second conductive vias 353 formed in the second dielectric layer 351 and electrically connected to the first wiring layer 34 and the second wiring layer 352. The built-up structure 35 is further disposed with a plurality of electrical contact pads 354 electrically connected to the second wiring layer 352. Subsequently, an insulating protection layer 36 is formed on the built-up structure 35, and the insulating protection layer 36 has a plurality of insulating protection layer openings 360 for exposing the electrical contact pads 354 therefrom, respectively.

The present invention further provides a package substrate having a semiconductor component embedded therein, comprising: a substrate body 30 having at least an opening 300; a semiconductor chip 20' fixed in position to the opening 300 in the substrate body 30, wherein the semiconductor chip 20' has an active surface 20a and an inactive surface 20b opposing each other. There are a plurality of electrode pads 201 and a passivation layer 22 disposed on the active surface 20a; the passivation layer 22 has a plurality of passivation layer openings 220 corresponding in position to the electrode pads 201, respectively. A plurality of metal rings 23' are formed on the passivation layer openings 220, respectively. A first dielectric layer 31 is disposed on the substrate body 30, the passivation layer 22, and the metal rings 23'. A plurality of dielectric layer openings 310 corresponding in position to the electrode pads 201, respectively, are formed to penetrate the first dielectric layer 31 so as for the electrode pads 201 to be exposed from the dielectric layer openings 310, respectively. A first wiring layer 34 is disposed on the first dielectric layer 31. A plurality of first conductive vias 341 in contact with the metal rings 23', respectively, are formed in the dielectric layer openings 310 and the passivation layer openings 220, respectively, so as for the first wiring layer 34 to be electrically connected to the electrode pads 201.

The passivation layer 22 comprises the first passivation layer 22a and the second passivation layer 22b. The first passivation layer 22a has a plurality of openings 220a for exposing the electrode pads 201 therefrom. The second passivation layer 22b is formed on the first passivation layer 22a and covers the electrode pads 201. The first passivation layer 22a is made of silicon nitride ($Si_3N_4$) or silicon dioxide ($SiO_2$). The second passivation layer 22b is made of polyimide or benzocyclobutene (BCB).

Moreover, a built-up structure 35 is formed on the first dielectric layer 31 and the first wiring layer 34. The built-up structure 35 comprises at least a second dielectric layer 351, a second wiring layer 352 stacked on the second dielectric layer 351, and a plurality of second conductive vias 353 formed in the second dielectric layer 351 and electrically connected to the second wiring layer 352. The second conductive vias 353 are electrically connected to the first wiring layer 34. Besides, the built-up structure 35 further comprises a plurality of electrical contact pads 354 electrically connected to the second wiring layer 352. The built-up structure 35 is further provided with an insulating protection layer 36 thereon. The insulating protection layer 36 has a plurality of insulating protection layer openings 360 for exposing the electrical contact pads 354 therefrom, respectively.

In summary, the present invention provides a semiconductor component and a method for fabricating a package substrate having the semiconductor component embedded therein. The method comprises the steps of: singularizing a wafer, which is disposed on a passivation layer and opposite to a plurality of metal pads of a plurality of electrode pads, into a plurality of semiconductor chips; disposing a corresponding one of the semiconductor chips in an opening of a substrate body; and forming a first dielectric layer on the semiconductor chip and the substrate body so as for the semiconductor chip to be fixed in position to the opening of the substrate body. As a result, the present invention can avoid the necessity of fastening via bonding material before forming a dielectric layer, which leads to an extra manufacturing process in prior arts. Besides, the present invention forms a plurality of dielectric layer openings in the first dielectric layer by laser and prevents the electrode pads from being penetrated by the metal pads; followed by removing the metal pads and the passivation layer in the dielectric layer openings so as to expose the electrode pads of the semiconductor chip, and forming a first wiring layer on the first dielectric layer as well as being electrically connected to the electrode pads. Hence, it is unnecessary to provide expanded pads prior to forming a built-up structure so that the cost and time to manufacture wafers can be reduced. Briefly, the present invention achieves technical effects including protection for electrode pads of a semiconductor chip, direct electrical connection, and reduction in the steps of a manufacturing process.

The above descriptions of the specific embodiments are intended to illustrate the preferred implementation according to the present invention, but are not intended to limit the scope of the present invention. Accordingly, all modifications and variations made to the specific embodiments by persons skilled in the art should fall within the scope of present invention defined by the appended claims.

What is claimed is:

1. A package substrate having a semiconductor component embedded therein, comprising:
   a substrate body having at least an opening;
   a semiconductor chip fixed in position to the opening of a substrate body and having an active surface with a plurality of electrode pads thereon and an opposing inactive surface, wherein a passivation layer is disposed on the active surface, the passivation layer having a plurality of passivation layer openings corresponding in position to the electrode pads, respectively;
   a plurality of metal rings disposed on the passivation layer openings;
   a first dielectric layer disposed on the substrate body, the passivation layer, and the metal rings, wherein a plurality of dielectric layer openings corresponding in position to the electrode pads, respectively, are formed to penetrate the first dielectric layer and expose the electrode pads therefrom; and
   a first wiring layer disposed on the first dielectric layer and electrically connected to the electrode pads by a plurality of first conductive vias formed in the dielectric layer openings and passivation layer openings, respectively, and configured to be in contact with the metal rings, respectively.

2. The package substrate of claim 1, wherein the passivation layer comprises a first passivation layer having a plurality of openings for exposing the electrode pads therefrom and a second passivation layer formed on the first passivation layer and covering the electrode pads.

3. The package substrate of claim 2, wherein the first passivation layer is made of silicon nitride ($Si_3N_4$) or silicon dioxide ($SiO_2$).

4. The package substrate of claim 2, wherein the second passivation layer is made of polyimide or benzocyclobutene (BCB).

5. The package substrate of claim 1, further comprising a built-up structure disposed on the first dielectric layer and first wiring layer.

6. The package substrate of claim 5, wherein the built-up structure comprises at least a second dielectric layer, a second wiring layer stacked on the second dielectric layer, a plurality of second conductive vias formed in the second dielectric layer and electrically connected to the first and second wiring layers, and a plurality of electrical contact pads electrically connected to the second wiring layer.

7. The package substrate of claim 6, further comprising an insulating protection layer disposed on the built-up structure and having a plurality of insulating protection layer openings for exposing the electrical contact pads therefrom, respectively.

* * * * *